United States Patent [19]
Bachem et al.

[11] Patent Number: 5,767,535
[45] Date of Patent: Jun. 16, 1998

[54] QUANTUM LAYER STRUCTURE

[75] Inventors: Karl-Heinz Bachem, Kirchzarten, Germany; Dan Fekete, Haifa, Israel

[73] Assignee: Fraunhofer-Gesellschaft zur Foerderung der angewandten Forschung e.V.

[21] Appl. No.: 718,373

[22] PCT Filed: Mar. 14, 1995

[86] PCT No.: PCT/DE95/00353

§ 371 Date: Dec. 18, 1996

§ 102(e) Date: Dec. 18, 1996

[87] PCT Pub. No.: WO95/26585

PCT Pub. Date: Oct. 5, 1995

[30] Foreign Application Priority Data

Mar. 25, 1994 [DE] Germany ............. 44 10 240.2
May 20, 1994 [DE] Germany ............. 44 17 798.4

[51] Int. Cl.$^6$ .................................................. H01L 33/00
[52] U.S. Cl. ................................................. 257/96; 257/94
[58] Field of Search ........................................ 257/96, 94

[56] References Cited

FOREIGN PATENT DOCUMENTS 0 610 893  8/1994  European Pat. Off. .

OTHER PUBLICATIONS

Japan Abstract No. 59–172785, vol. 9, No. 27 (E–294), Sep. 29, 1984.
*Soviet Technical Physics Letters*, 12(6), Jun. 1986, entitled "Quantum–well laser with a single heterojunction" by A.N. Baranov et al.
*Applied Physics Letters*, 61(16), Oct. 19, 1992, entitled "Proposal and verification of a new visible light emitter based on wide band gap II–VI semiconductors" by M.C. Phillips et al.
*Journal of Cyrstal Growth*, 127, No. 1–4, Aug. 1993, entitled Gas source molecular beam epitaxy of alternated tensile/compressive strained GaInAsP multiple quantum wells emitting at 1.5 μm by J–Y. Emery et al.
*Applied Physics Letters*, 59(19), Nov. 1991, entitled "Linewidth enchancement factor for GaInSbAs/GaSb lasers" by A.N. Baranov et al.
Conference on Lasers and Electro–Optics, (CLEO 1991) *Technical Digest Series*, vol. 10, May 12–17 1991, entitled "Monolayer thick GaAs–GaAsSb strained layer quantum well lasers" by J.H. Lee at al.
*Applied Physics Letters*, 60(25), entitled "Observation of laser emission in an InP–AlInAs type II superlattice" by E. Lugagne–Delpon et al.

*Primary Examiner*—Stephen Meier
*Attorney, Agent, or Firm*—Evenson, McKeown, Edwards & Lenahan P.L.L.C.

[57] ABSTRACT

Disclosed is a quantum layer structure, in particular, for lasers or detectors, having at least four semiconductor layers (S1, S2, S3, S4), with at least two internal layers (S2, S3) being disposed between two external barrier layers (S1, S4). The present invention is distinguished in that, without the application of an electric voltage, the lower edge of the conduction band of one the internal layers has an absolute minimum and the lower edge of the valence band of another internal layer has an absolute maximum, and that at least two internal layers having the absolute minimum and the absolute maximum possess quantized hole states respectively electron states.

15 Claims, 10 Drawing Sheets

TABLE 1 EMBODIMENTS

| STRUCTURE | S5 | S1 | S2,S3 | S4 | S6 | SUBSTRAT |
|---|---|---|---|---|---|---|
| 1 | AlGaAs | GaAs | ZQW p | GaAs | AlGaAs | GaAs |
| 1 | AlGaAs | AlGaAs | ZQW p | GaAs | AlGaAs | GaAs |
| 2 | GaInP | GaAs | ZQW p | GaAs | AlGaAs | GaAs |
| 3 | GaInP | GaAs | ZQW p | GaAs | GaInP | GaAs |
| 4 | AlGaInP | GaInP l,p | ZQW p | GaInP l,p | AlGaInP | GaAs |
| 5 | AlGaInP | GaInP l,p | ZQW p | GaAs | AlGaAs | GaAs |
| 6 | | | | | | |
| 7 | InP | GaInAsP l,p | ZQW l,p | GaInAsP l,p | InP | InP |
| 8 | AlInAs | GaInAsP l,p | ZQW l,p | GaInAsP l,p | AlInAs | InP |
| 9 | | | | | | |
| 10 | | | | | | |

FIG. 12

QUANTUM LAYER STRUCTURE

BACKGROUND AND SUMMARY OF THE INVENTION

1. Technical Field

The present invention is related to quantum layer structures, in particular for lasers or detectors, having at least four semiconductor layers. Internal layers are disposed between two outer barrier layers.

The quantum layer structures are composed of layers of different compounds, the respective emission or absorption wavelengths of which are larger due to the invented coating than the respective emission or absorption wavelengths of the compounds themselves. Application of the invented quantum layer structures onto gallium arsenide substrates makes wavelengths of 1.3 µm or more possible. Using InP substrates makes wavelengths in a range of approximately 2 µm and 5 µm possible. Suitable for use are quantum layer structures such as, by way of illustration, semiconductor injection lasers, modulators and detectors, in particular also photovoltaic detectors (see, e.g., Y: Sugiyama et al., J. Cryst. Growth, 95, 1989, pp 263–366).

2. State of the Art

Examining the loss function of a fiber glass shows minimal losses at wavelengths of 1.3 µm and 1.55 µm. With regard to this see, for example, S. M. Sze, Physics of Semiconductor Devices, $2^{nd}$ Edition (1981) , p. 704. The spectral range of 1.3 µm is the international standardized wavelength range for the optical transmission of information via fiber glass transmission paths. It is to be expected that this spectral range dominating the large networks of nationally and internationally operating telephone companies will extend to private information consumers ("fiber to the home"). Optoelectronic components for this spectral range are, therefore, of particular technological importance.

Optoelectronic components such as, for instance, lasers, detectors and modulators for the spectral range of 1.3 µm are without exception fabricated on indium phosphite substrates.

The medium wave infrared range (2–5 µm) is of considerable technological significance for laser spectroscopic detection of trace gases in the atmosphere, because nearly all infrared active gases have more or less strong absorption bands in this wavelength range. This application is called "environmental monitoring". Today, lead salt laser diodes are utilized in this use. Even after 20 years of development, these components are still in poor technological condition. They have to be cooled to a low operating temperature, the mode spectrum is instable, and the reliability meets only very low technological application standards.

In order to achieve a wavelength range of 1.3 µm, other substance combinations such as, for example, $Ga_xIn_{1-x}As_yP1_{-y}$, $GaAs_xSb_{1-x}$, $InAs_xP_{1-x}$, $(Al_xGa_{1-x})_yIn_{1-y}As$ or $In_xGa_{1-x}As$, with x and y being able to vary from 0 to 1, observing the respective fundamental band gaps and the most promising candidates with wavelengths corresponding thereto. However, the technology of these components is difficult and the technically desirable integration with complex electronic circuits on the same substrate could not be achieved despite considerable international research efforts.

The longest emission wavelength hitherto achieved with a laser on a gallium arsenide substrate is approximately 1.1 µm. The active layer of this laser is a mechanically deformed quantum layer structure of gallium indium arsenide (P. K. York et al, Journal of Crystal Growth 107 (1991), 741). A notably longer emission wavelength cannot be achieved with this structure for essential reasons.

In the publication "Linewidth Enhancement Factor for GaInSb/GaSb lasers", A. N. Baranov, Appl. Phys. Lett. 59 (1991), 2360 a heterolaser structure is disclosed in which a band deformation, in which localized holes and electrons can recombine in a radiating manner, is achieved at a pn-junction due to laser operation. It is the band deformation that permits quantizing of respective electron or hole energies in the region of the band deformation. This means that there is no quantization with a weak current injection.

The utilized semiconductor materials can only be applied in a lattice matched manner to a GaSb substrate. Thus, they are not accessible for technically relevant substrates such as, in particular, GaAs.

Moreover, the presented laser has the drawback that a high threshold current has to be employed in order to start the laser procedure. All the known methods of optimizing laser structures, such as, by way of illustration, lowering the threshold current, raising the modulation velocity and output, cannot be applied to the laser structure presented by Baranov, because a pn-junction has been used. Furthermore, in pulse operation of this laser, there is a strong frequency jitter.

SUMMARY OF THE INVENTION

The object of the present invention is to introduce quantum layer structures which permit a reduction of respective emission or absorption energies and an increase in the respective emission or absorption wavelengths compared to known quantum layer structures. Another object of the present invention is to provide technological devices such as lasers or detectors which, due to a low threshold current, are distinguished by a high output and a high modulation velocity.

An element of the present invention is that, in particular, quantum layer structures, whose respective emission or absorption wavelengths lie at 1.3 µm and/or 1.55 µm can be fabricated on gallium arsenide substrates, whereas in the case of InP substrates wavelengths between 2 and 5 µm are possible.

Subsequently, lasers, such as for instance semiconductor injection lasers, modulators, detectors and hetero-bipolar transistors, can be fabricated out of these quantum layer structures. Preferably, optoelectronic components with complicated electronic circuits can be monolithically integrated on gallium arsenide or indium phosphide substrates with the invented quantum layer structures.

A fundamental advantage of the present invention is the relatively low price achieved if gallium arsenide substrates are employed compared to, by way of illustration, indium phosphite substrates, and if indium phosphite substrates are used the drawbacks, in particular those which occur if lead salt laser diodes are used, notably the necessary cooling, the instable mode spectrum and the unsatisfactory reliability, are avoided. These advantages already can be seen during the fabrication of the individual components.

In accordance with the present invention, quantum layer structures are proposed which are provided with at least four semiconductor layers (S1, S2, S3, S4), with at least internal layers (S2, S3) being disposed between two outer barrier layers (S2, S3). It is essential in that even without application of an electric voltage, the lower edge of the conduction band of one of the internal layers has an absolute minimum and the lower edge of the valance band of another internal layer has an absolute maximum, and that at least the two internal layers which have the absolute minimum and the absolute maximum have quantized hole or electron states.

The absolute minimum and the absolute maximum can also be present in the two mentioned internal layers if no other doping substances are integrated in the layers or interface layers. Furthermore, the utilized layers can, of course, also be doped or have voltage applied to them without the mentioned extreme values disappearing.

If the layers having the extreme values are very thin, localized electron states or hole states, respectively, may exist. Furthermore, if the mentioned layers are spaced closely together, their characteristic functions will overlap. Advantageously, the characteristic functions overlap to the degree that a radiation recombination of electrons and holes from the respective layers is made possible. A typical gap value between the layers up to which a radiation recombination occurs is 1 nm.

An efficient laser having few modes or only one mode requires that the recombination process between the holes and the electrons, whose characteristic functions overlap, be the dominant radiation recombination process in the layer structure.

In order to increase the wavelengths of the emitted or absorbed light, it may be useful to place another layer between the two internal layers having the maximum upper edge of the valance band and the minimum lower edge of the conduction band. This additional layer can be utilized for strain compensation and/or to form a gradual transition between the surrounding layers.

In order to use the quantum layer structure in technically relevant components usually employing GaAs- or InP substrates, at least one layer should be at least partially pseudomorphously or lattice matched. Preferably several layers are lattice matched in order to increase the quantum yield and decrease deformation. However, dislocations may also be desirable, as the example of the gallium nitride based blue light diode shows, in which a very high quantum yield is obtained with a dislocation density of approximately $10^{10}/cm^2$.

If the sequence of layers of the quantum layer structure have lattice constants which are too different, it may be necessary, if thick layers are employed, to place strain compensating layers between the sequence of layers. Phosphorus containing layers, in particular $(GaAs_xP_{1-x})$ with x between 0 and 1 proved to be advantageous for lattice matching and strain compensation. Of course, strain compensating layers of tertiary or quaternary compounds of gallium, arsenic and phosphorus may also be employed.

In order to obtain better growth conditions or specific anisotropic physical properties of the quantum layer structure, the latter can be fabricated under tensile stress.

The material of the layers of the quantum layer structure is, of course, not limited to III–V compounds. They can have at least two different II–VI compounds and/or IV–VI compounds and/or III–V compounds and/or group IV compounds.

The employed semi-conductor layers can have compounds of at least two or three of the following elements Al, Ga, In, P, As and Sb. In this manner, an optimum adaption of the band gaps and relative positions of the upper edge of the valance band and the lower edge of the conduction band to the respective application can be achieved. The option of doping the employed semiconductors permits, on the one hand, a kind of "band structure engineering" and, on the other hand, a setting of the desired conductivity of the materials used.

If the invented quantum layer structure is to be utilized in a laser, it is recommended that at least one quantum layer be embedded in a waveguide structure of II–IV, III–V, IV–VI or group IV semiconductor materials or combinations of these semiconductor materials.

An element of the present invention is that the sequence of layers of the quantum well structure is selected in such a manner that type I heterojunctions as well as type II heterojunctions are possible.

With a layer sequence representing a type II heterojunction, it is useful to match the injection direction of the electrons and respective defect electrons or holes with the barrier layer. This is useful, by way of illustration with semiconductor lasers, because the threshold current is minimized in this manner. However, the employed materials can also form such a small barrier in a type II heterojunction that it is unimportant for the function of the component which way the injection direction of the electrons or defect electrons is.

If the barrier is quite large in a type II heterojunction, there is another possibility of evading the possibly created barrier. For this purpose, the waveguide is executed asymmetrically.

However, the barrier can also be reduced in height, if gallium arsenide substrates are employed, by adding, for example, aluminum. An increase in aluminum content in $Al_yGa_{1-y}As$ decreases the height of the barrier. However, it was discovered that an increase in aluminum content decreases the optical quality of the waveguide. For this reason, an aluminum content of about 10% seems best suited.

BRIEF DESCRIPTION OF THE DRAWINGS

The present invention is made more apparent in the following using preferred embodiments with reference to the drawings, to which moreover is referred for the disclosure of all the inventive details not explained in more detail herein, by way of example, without the intention of limiting the spirit or scope of the overall inventive idea.

FIG. 4b is a simplified band diagram of FIG. 4a;

FIG. 12 is a table of preferred embodiments according to the invention.

DETAILED DESCRIPTION OF THE DRAWINGS

The same parts in the following figures bear the same reference numbers, thus obviating renewed introduction and only requiring that deviations in these figures from the first preferred embodiment be explained.

Figure 1:
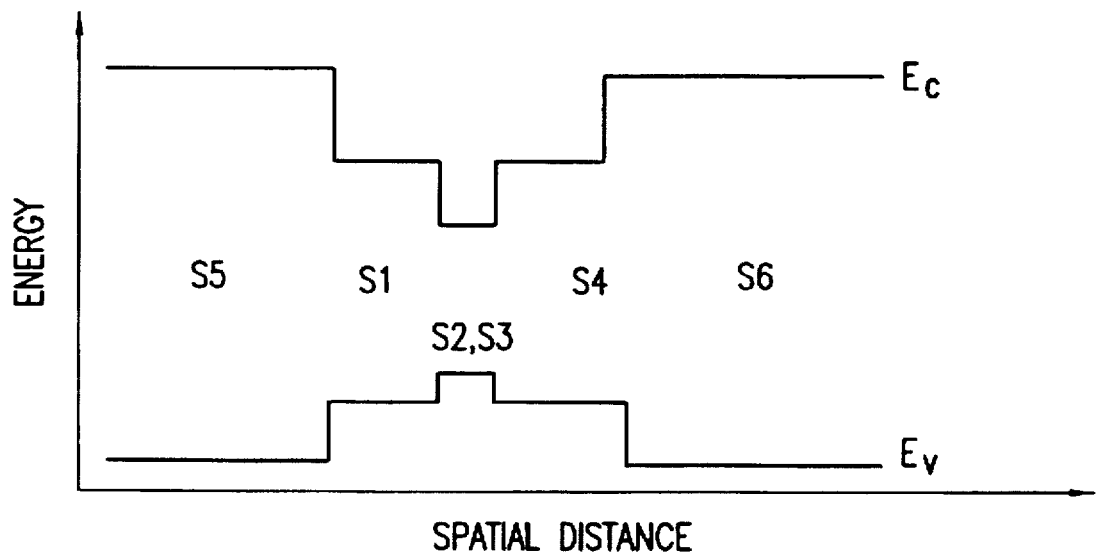
FIG. 1 is a band diagram of a conventional AlGaAs/GaAs quantum well laser having InGaAs quantum wells.

FIG. 1 shows a band diagram of a conventional AlGaAs/GaAs quantum well laser having InGaAs quantum wells. What is shown is the simplified (field-free case) band diagram. S5 and S6 are the optical confinement layers of AlGaAs, layers S1 and S4 of GaAs form the optical waveguide in conjunction with the enclosed respective active layer S2 and S3 of GaInAs.

The band diagram of this quantum layer structure shows a "direct" band gap. "Direct" is not used here in the conventional sense. In view of the fact that in the representation in FIG. 1 the space is not an impulse space but rather a location space, direct is put in quotation marks.

Before discussing the figures in more detail, some of the terms used will be explained.

Band gap $E_g$ is the energy difference between the lower edge of the conduction band CBM, i.e. $E_c$, and the upper edge of the valence band VBM, i.e. $E_v$. The "direct" band gap is the band gap in which the lower edge of the conduction band lies spatially directly above the upper edge of the valence band in the figures. The "indirect" band gap is the band gap in which the CBM does not lie directly above the VBM in the figures.

In FIG. 1, for instance, GaAs is used as the substrate (S5, S6). The respective quantum layer or quantum well (S2, S3) may be, by way of illustration, gallium arsenide antimonide or gallium indium arsenide. For simplification, a manner of depiction was chosen in FIG. 1 in which no band deformation predominates. As this hardly ever occurs in practice, the figures should be viewed solely as examples, which are not confined to flat band behavior.

The fundamental GaAs band gap at 0 K is 1.519 eV. The fundamental band gap of gallium arsenide antimonide or gallium indium arsenide is smaller than that of GaAs. GaAs layers can therefore function as barrier layers for electrons or holes if the material of the quantum layer enclosed in the GasAs, e.g. GaAsSb of GaInAs, is a material having a smaller band gap.

Skilled application of the material of the quantum layer(s) on the GaAs, by means of, by way of illustration molecular beam epitaxy (MBE), permits growing the quantum layer(s) epitaxially. Due to the varying lattice constants, relatively high pressure strains are generated in the grown quantum layer in this process. At a certain layer thickness, bonds in the quantum layer would break creating a polycrystalline layer (cf., e.g. J. W. Matthews and A. E. Belakeslee, J. Cryst. Growth, 27, 1974, 118). In order to prevent this effect, it is possible to let the quantum layer structure grow under tensile stress. Only this measure achieves theoretical quantum layer structures having a respective emission wavelength or absorption wavelength of respectively 1.3 μm or 1.55 μm.

Figure 2:
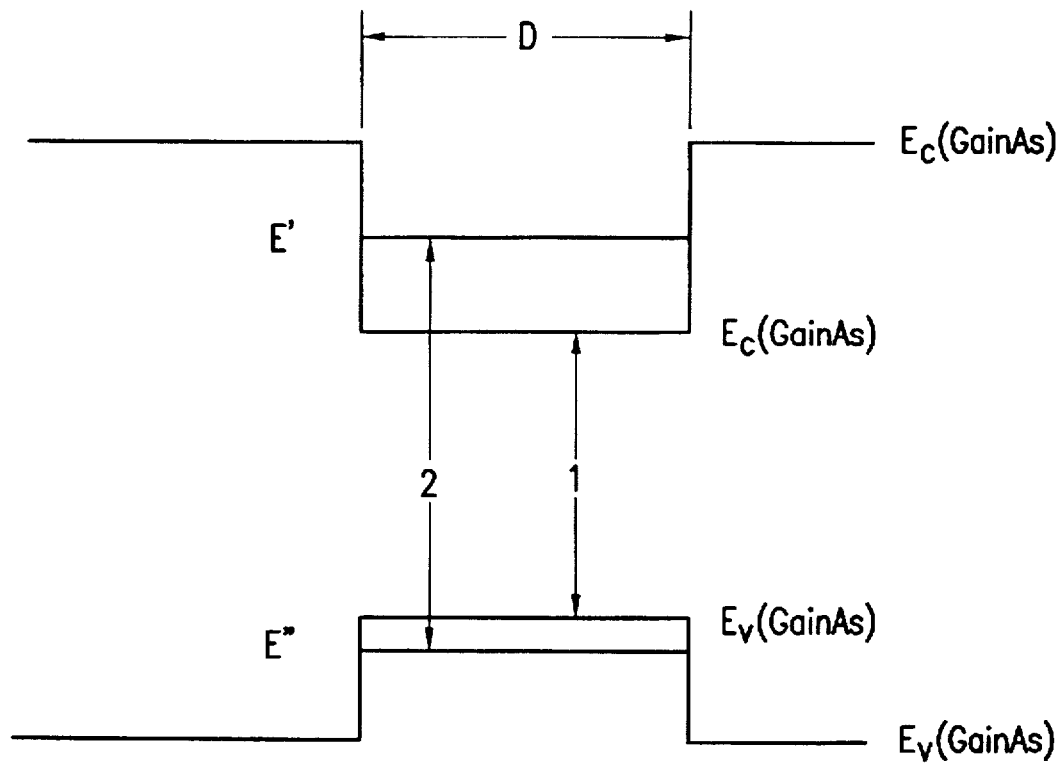
FIG. 2 is an enlarged detail (S1; S2,S3; S4) of FIG. 1 with a simplified energy scheme (E', E"), higher energy states are not shown and the existence of light and heavy defect electrons has not been taken into account.

FIG. 2 is an enlarged detailed diagram from FIG. 1 with a simplified energy term scheme (E', E"). The layers S1, S2 and S3 and S4 are discernible. Higher energy states than the ones shown are not depicted.

Arrow 1 marks the band gap in the quantum well. This band gap is only dependent on the Indium content of the GaInAs quantum layer. If the thickness D of this layer is greater than a few 10 nm, the emission wavelength of the laser corresponds rather exactly to this band gap (1 eV=1.24 μm). If the thickness is distinctly lower than 10 nm, the emission wavelength shortens with the decreasing thickness D. The reason for this is the so-called quantum size effect which becomes stronger with decreasing thickness D. The lowest electron energy in the quantum well is now no longer the band edge energy $E_c$ (GaInAs), but the somewhat higher energy E'.

Due to the greater mass of defect electrons, the effect is weaker for the defect electrons in the valence band of the quantum well. Their lowest energy E" is therefore only a little larger than $E_v$ (GaInAs). The dominant transition for the emission wavelength of the laser is between E' and E" (arrow 2). The energies E' and E" coincide with the band edge energies $E_c$ (GaInAs) and Ev(GaInAs) only for thick quantum wells and thus the negligible quantization effect. The actual relationships in the valence band (light and heavy defect electrons, etc.) are somewhat more complicated than shown here. These fine points are not significant for the matters under discussion here. All told, the quantization effect results in the emission wavelength continuing to decrease with a decreasing thickness D and therefore a growing gap E'-E".

If the goal is an emission wavelength as long as possible, one will first turn off the quantization effect by selecting a large thickness D and, secondly, by selecting for the quantum well, a $Gas_xIn_{1-x}As$ having a high In content (small "x" value) and therefore a correspondingly small band gap (small difference $E_c$ (GaInAs)–$E_v$(GaInAs)).

$Ga_xIn_{1-x}As$ and GaAs have a cubic lattice structure, but do not have the same lattice constants for x<1. The lattice constant of $Ga_xIn_{1-x}A$ grows linearly with a decreasing "x" value from 0.56 nm ($Ga_1In_0As$=GaAs) to 0.66 nm ($Ga_0In_1$= InAs). The attempt to grow GaInAs on GaAs epitaxially shows that this is only possible for up to a certain thickness for a certain GaIn mixture of the GaInAs layers.

If, for instance, $Ga_{0.8}In_{0.2}As$ layers (x=0.8 and 20% indium content, respectively), of e.g. 1.10 and 100 nm thickness are placed, by way of illustration, in an epitaxy system on GasAs substrates, the 1.10 and 100 nm thick layers proved to possess perfect crystal quality. X-ray analytical methods show that, in planes parallel to the substrate plane, the GaInAs assumes the exact periodicity of the GaAs crystal, but is no longer perfectly cubic. The elementary cells of the GaInAs lattice are somewhat elongated perpendicular to the substrate surface. The elementary cell is no longer cubic, but rather tetragonal. GaAs substrate (cubic) and GaInAs layer (tetragonal) are no longer isomorphous but crystallographically not totally different. In certain planes, they have the same periodicity, therefore one says they are pseudomorphous. The tetragonal deformation is caused by the biaxial mechanical deformation of the distorted cubic elementary cells of GaInAs.

There are, therefore, considerable deformation energies increasing with growing layer thickness stored in the pseudomorphous layers. This results in the collapse of the well-oriented growth if a so-called critical layer thickness is exceeded. The GaInAs no longer endures the lattice structure forced upon it and returns to its natural cubic form while forming so-called misfit dislocations. The optical and electrical properties of these layers interspersed with dislocations are poor. Good lasers can no longer be made from this material. The critical layer thickness in which the pseudomorphous structure collapses depends only on the In content (see J. W. Matthew and A. E. Blakeslee, J. Cryst. Growth, 27 (1974), 118–125) and all the attempts undertaken in the past ten years to suppress the collapse by means of growth tricks have been a failure. Matthew and Blakeslee formulated a relationship between the critical layer thickness and lattice mismatch twenty years ago.

This principle has very grave consequences for the construction of laser structures. If the In content of the quantum well is increased, which leads to longer emission wavelengths, the layer thickness of the quantum wells simultaneously has to be further reduced due to the decreasing critical layer thickness. With decreasing layer thickness, however, the energy states E' and E" grow rapidly in the wrong direction and shift toward shorter emission wavelengths. All told, it turns out that with growing In content and fully optimizing the layer thickness, if there is approximately 35% In content, a maximum emission wavelength of 1.1 μm is yielded. Due to the rapidly diminishing critical layer thickness, larger In contents lead to an uncontrolled quantization effect. Then the emission wavelengths decrease again.

Figure 3:
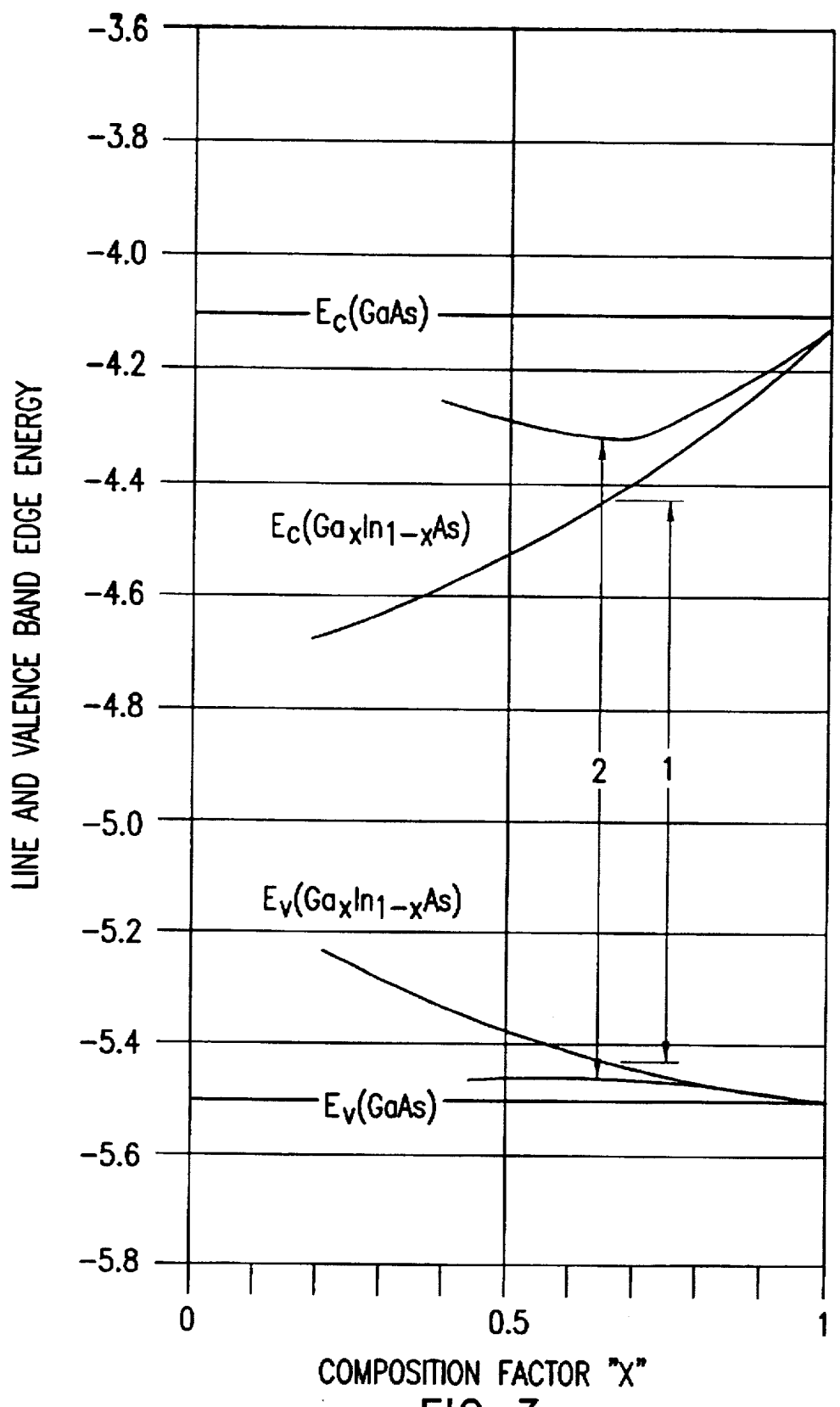
FIG. 3 is a graph of the position of the conduction and valence band edges (bold drawn curves) and the lowest electron and defect electron energy (thin drawn lines) in pseudomorphous, critically thick $Ga_xIn_{1-x}As$ quantum wells as the function of composition factor "x", arrows 1 and 2 show the band gaps and recombination energy in the quantum well for a well having 35% In content, fix points for x=1 are band edge energies of the GaAs layers on the right and on the left of the well.

FIG. 3 shows a graph of these relationships. The bold lines show the course of the band edge energies and the thin lines show the energies E' and E" for the quantum wells having a maximum, thus critical layer thickness.

One solution to this problem is to put strain compensating layers into the quantum layer structures, thereby reducing the strains generated by the growth of the layers and permitting the epitaxial growth of thicker layers. Strain compensating layers of this type, which may be composed of a variety of materials can be put into the layer structure at various sites depending on the application.

If the employed materials have not been doped, the Fermi energy is in the middle of the band gap. Of course, various dopings can be used for the respective different materials thereby shifting the relative positions of the upper edge of the valence band or the lower edge of the conduction band in relation to each other in this way.

Figure 4A:
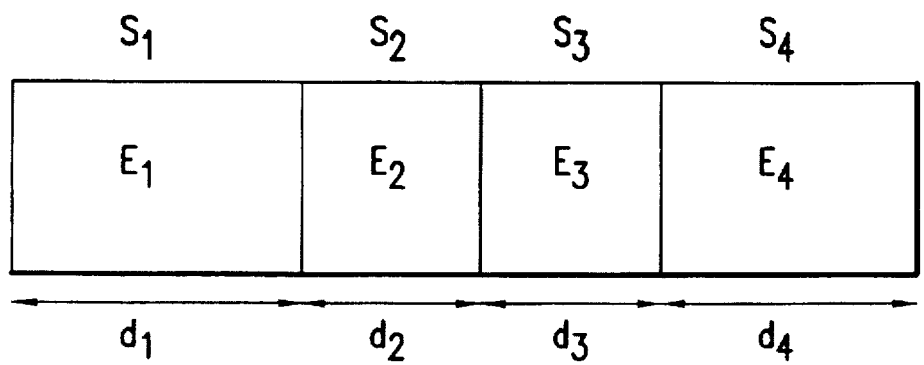
FIG. 4a is a sequence of semiconductor layers of an invented quantum layer structure with layers S1, S2, S3 and S4, having layer thicknesses d1, d2, d3, d4 and the energy gaps E1, E2, E3 and E4.

FIG. 4a shows a diagram of an invented quantum layer structure. The quantum layer structure can be epitaxially deposited or a substrate of gallium arsenide or indium phosphite. The substrate determines the spectral range for which the quantum layer structure is suited.

The quantum layer structure is composed of four semiconductor layers S1, S2, S3 and S4 having thicknesses d1, d2, d3 and d4. The layers S1 and S3 have the band gaps E1 and E4. These layers are referred to hereinafter as barrier layers. Semiconductor layers S2 and S3 having band gaps E2 and E3 are embedded between the barrier layers (S1, S4).

Figure 4B:
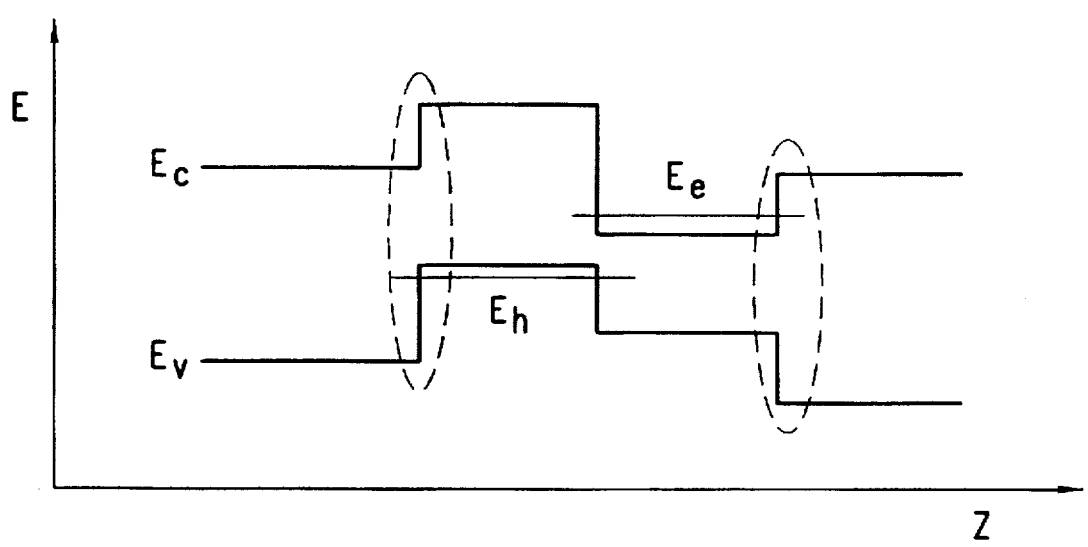

FIG. 4b shows, by way of illustration, the course of the conduction and valence band edge energies $E_c$ and $E_v$ for the layer sequence S1-S2-S3-S4 against the position coordinate z which is perpendicular to the layer sequence. S1 can be of GaAs, S2 of $GaAs_xSb_{1-x}$, S3 of $Ga_yIn_{1-y}As$ and S4 of $Ga_{0.5}P$ or $Al_{0.2}Ga_{0.8}As$. In this type of material combination, the heterojunction from layer S1 to layer S2 encircled with a dotted line on the left is a type II heterojunction and the encircled junction from S3 to S4 on the right a type I.

If these materials are employed, the band gap E4 of layer S4 is somewhat larger than that of layer S1. If gallium arsenide is used for layer S4, the band gaps E4 and E1 are the same size.

An essential factor of the present invention is the selection of the materials for the layers S2 and S3 and the course of the band edges in the central region of the quantum layer structure yielded by this selection.

The layer S3 has an absolute minimum lower edge of the conduction band and the layer S2 has an absolute maximum upper edge of the valence band also in the region of the layer stack. The quantized electron states and hole states, the energies of which are closest to VBM respectively CBM, are depicted in FIG. 4b with $E_3$ and $E_h$.

Figure 4C:
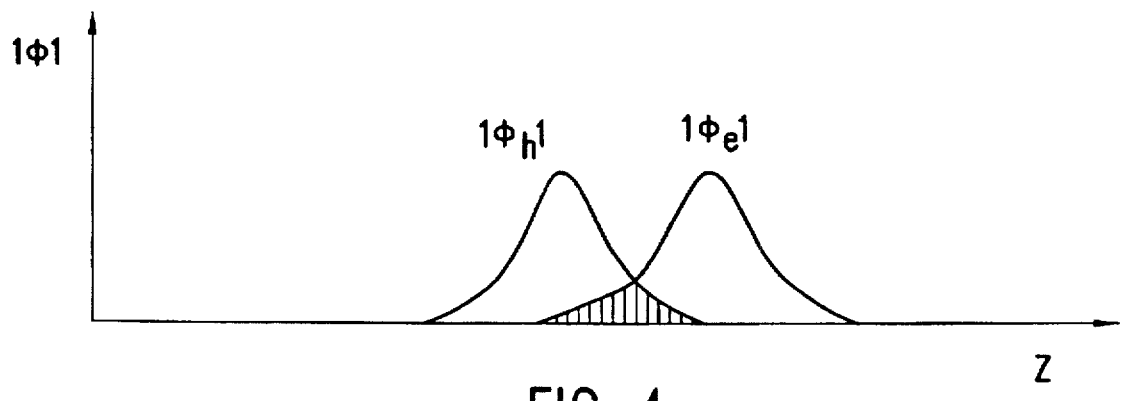
FIG. 4c illustrates the number of characteristic functions of the holes $(\Phi_h)$ and of the electrons $(\Phi_e)$.

It is essential for the functioning of the invented laser that the number of characteristic functions of these localized electron states and hole states overlap in such a manner that a radiation recombination of these electrons with these holes is possible. For this overlap see FIG. 4c. This overlapping already exists without applying an external voltage. The advantage is that there is a large overlapping of the characteristic functions of the electron states and the hole states even without applying voltages, which lead to band deformation and which, with less effective components, cause quantization of the electron states and hole states to occur. Even with a very small injection of current, by way of illustration, a laser fabricated from a sequence of layers of this type starts to laser with high efficiency. The essential advantage of a quantum layer structure of this type, notably the small threshold current, only comes about if electrons and holes are already enclosed in quantum troughs below the laser threshold.

Figure 5:
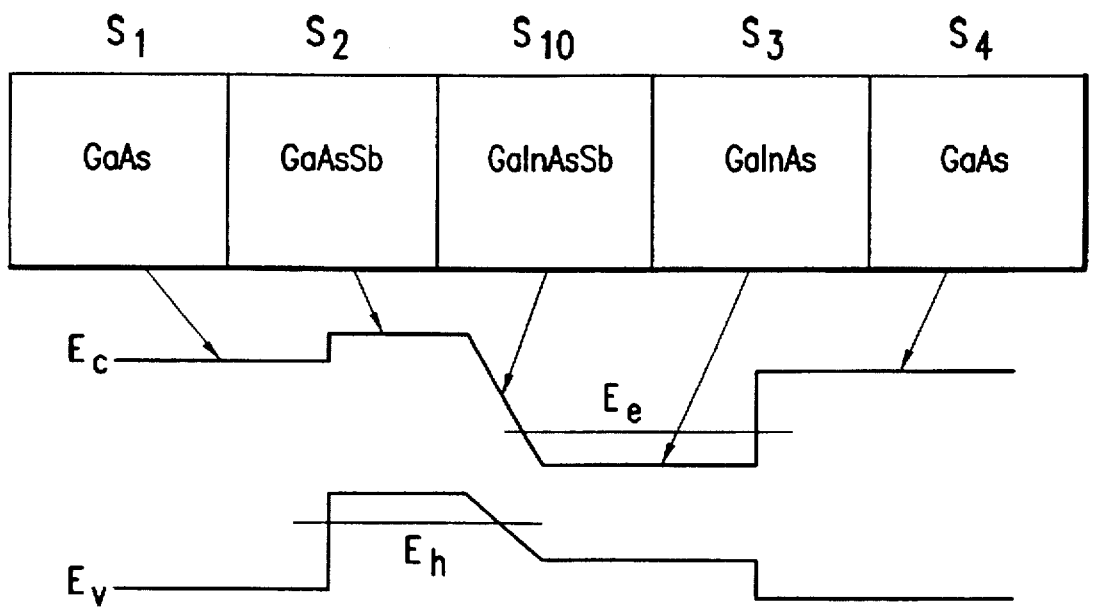
FIG. 5 illustrates a quantum layer structure, in which, compared to FIG. 4), a layer S10 has been added between layers S2 and S3, permitting gradual transition from GaAsSb to GaInAs.

FIG. 5 is a modification of the quantum layer structure depicted in FIG. 4. Placed between the layers S2 and S3 is a layer S10 which can be a quaternary layer such as, for example $Ga_xIn_{1-x}As_ySb_{1-y}$ which, with continuously varying x and y, continuously passes from the chemical composition of layer S2 over to the chemical composition of layer S3. Such a gradual transition frequently occurs unintentionally in fabricating layer structures, because hitherto abrupt, i.e. atomic, junctions are only possible with few layers. However, if this intermediate layer S10 is thin, i.e. up to approximately 1 nm, so that the characteristic functions of the electrons and holes can still overlap, this intermediate layer only minimally disturbs the function of the invented device.

Figure 6:
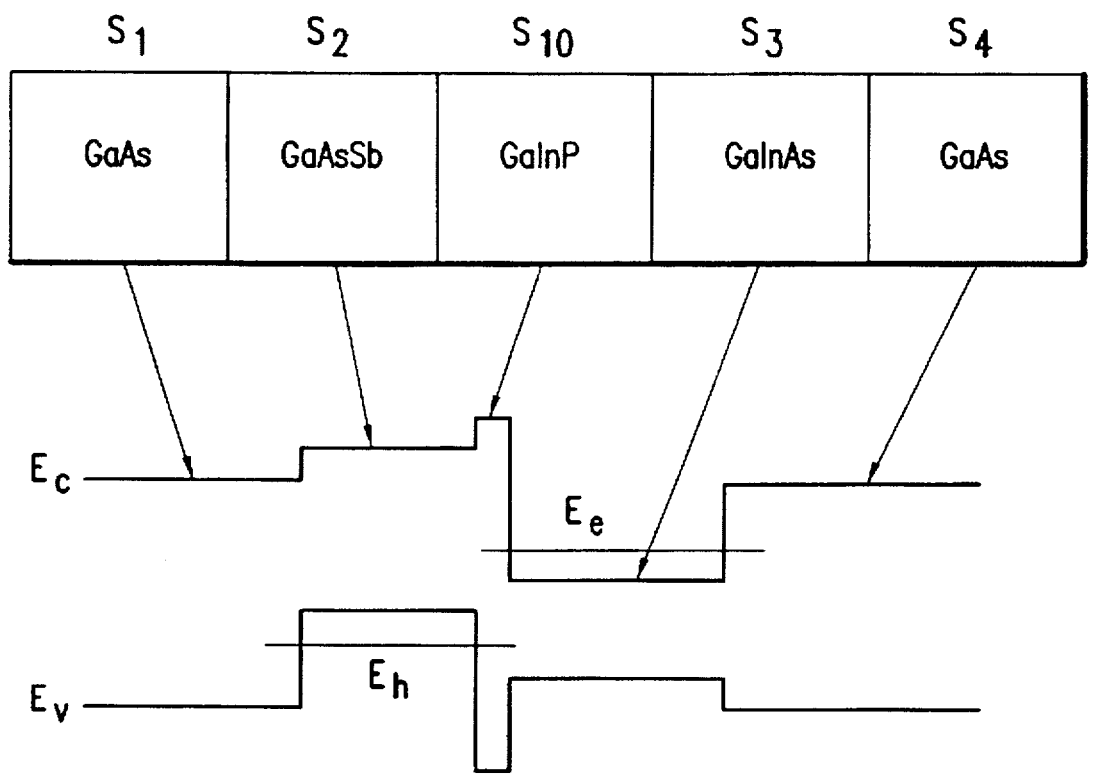
FIG. 6 illustrates a quantum layer structure according to FIG. 5 in which a GaInP layer is employed, by way of illustration, for strain compensation instead of the gradual transition.

In FIG. 6, a GaInP layer, which can compensate the possible elastic strain between layers S2 and S3, is intentionally placed as the intermediate layer. As photoluminescence data of an invented quantum layer structure confirm, with layers of approximately 1 nm, radiation recombination still occurs between $E_e$ and $E_h$.

Strain compensating layers can, of course, also be placed, by way of illustration between layers S1 and S2 as well as between layers S3 and S4.

Preferably, semiconductor materials, which are chemically composed in such a manner that a part of this semiconductor layer is biaxially stretched and another part is biaxially buckled, are utilized in quantum well structures. These semiconductor materials are utilized either completely or regionwise pseudomorphously in the quantum layer structure. Of course, biaxially stretched or biaxially buckled layers can be placed in the waveguide structure enclosing the quantum layer.

Compensation of the mechanical strains using straincompensating layers is especially necessary if multiple mechanically stressed quantum layer structures are to be joined to form an active layer. In order to permit this, for instance, phosphorus is placed in the barrier structure for strain compensation. In other words, for example, gallium arsenide phosphite layers can be utilized as strain compensating layers. Furthermore, quaternary compounds of the substances gallium, indium, arsenic, antimony and phosphorus may be used as strain compensating layers.

The multiple layered quantum layer structures can be fabricated by utilizing tensile stress for compensating the compressive strain created by the various lattice parameters of the different layers. Typically, the production processes such as, e.g., molecular beam epitaxy (MBE), chemical vapor deposition (CVD), metal organic chemical vapor deposition (MOCVD) and low pressure chemical vapor deposition (LPCVD), etc. may be employed.

In order not to crowd the figures, the quantization effect has been omitted in the following reflections.

Figure 7:
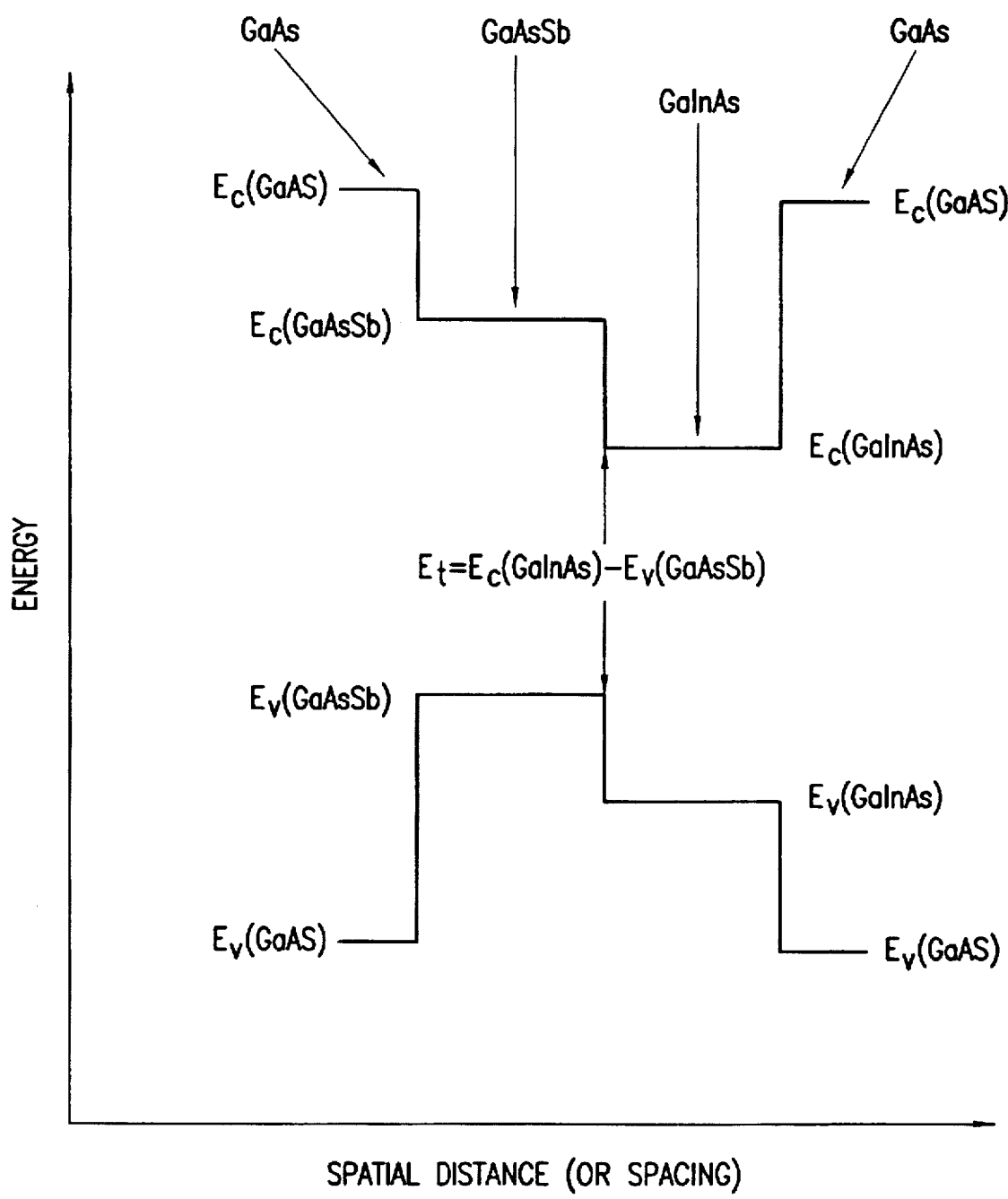
FIG. 7 is an enlarged detail from a band diagram of a two-layered AlGaAs/GaAs quantum well laser of GaAsSb and GaInAs with a "type I" heterojunction between GaAs and GaAsSb. The reference numbers for the energy level of the text are plotted.

FIG. 7 shows the band diagram of a quantum layer laser having a two-layered quantum well (GaAsSb/GaInAs). It is presumed here that the heterojunction (GaAsSb/GaInAs) lying in the quantum well and the heterojunction (GaAsSb) lying on the left edge of the quantum well are each of "type I".

Figure 8:
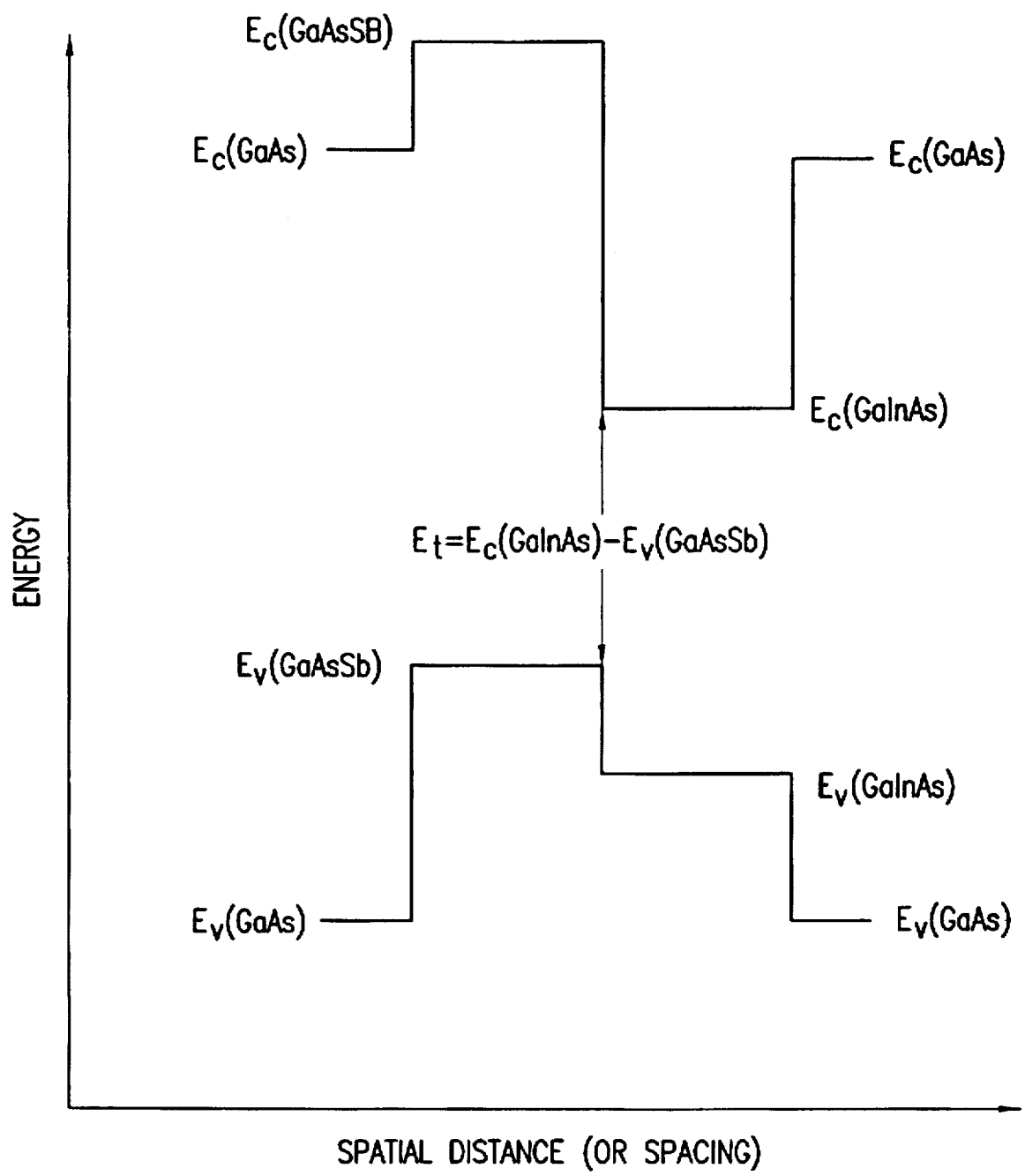
FIG. 8 is an enlarged detail similar to FIG. 7 except with a "type II" heterojunction between GaAs and GaAsSb.

FIG. 8 shows a laser structure having the same sequence of layers as in FIG. 7 and "type II" heterojunctions in the interior and at the left edge between GaAs and GaAsSb.

If a "type I" heterojunction is at the edge of the quantum well, the conduction band edge energy $E_c$ (GaAsSb) is smaller than the conduction band edge energy $E_c$ (GaAs) of the adjacent GaAs.

If $E_c$ (GaAsSb) is greater than $E_c$ (GaAs), there is a "type II" heterojunction at the edge. The quantum well for the electrons is now narrower and an electron barrier now forms in the course of the conduction band edge.

The internal heterojunctions are designated as "type I" in FIGS. 7 and 8 in agreement with all available data. The present invention, however, is not limited to "type I" heterojunctions, but rather, as will be shown later on, "type II" heterojunctions can also be used.

Figure 9A:
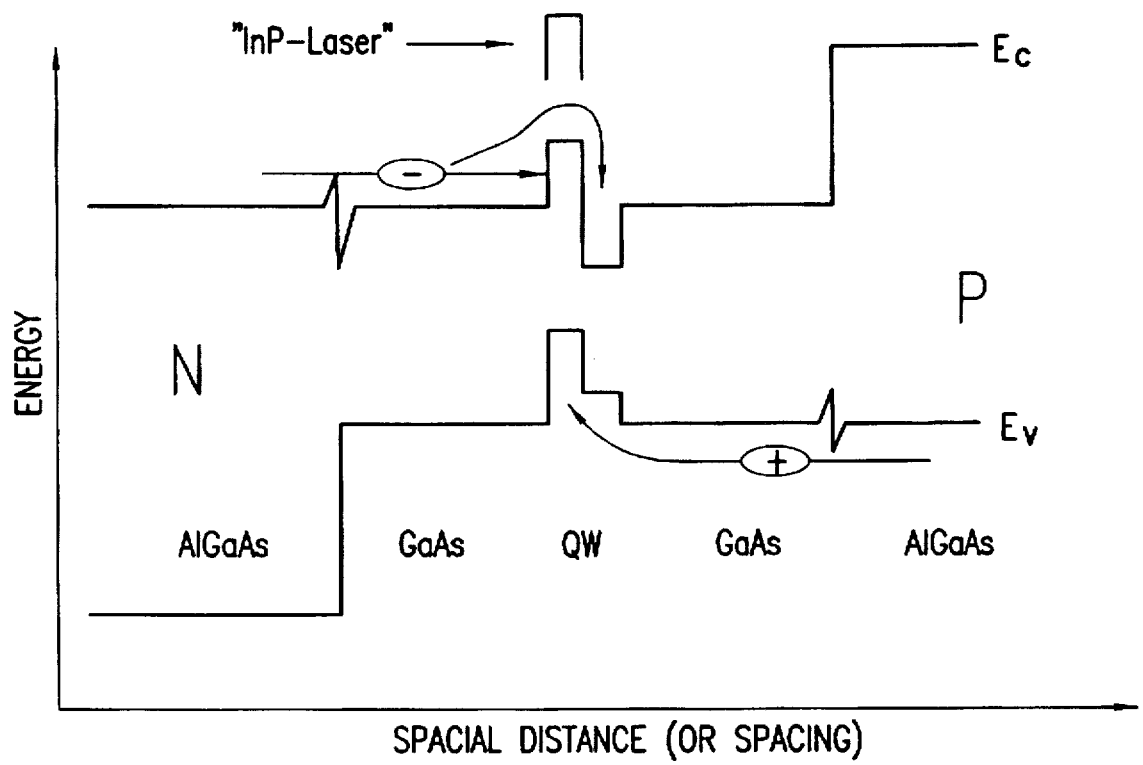
FIGS. 9a and 9b are diagrammatic representations of the band diagrams of two laser structures with "type II" heterojunctions with strong injection with FIG. 9a being a top picture with "falsely polarized" barrier position, and FIG. 9b being a bottom picture with "correctly polarized" barrier position.

When the quantization effect (wide quantum wells) is neglected, the recombination radiation for the transition corresponds with the designated transition energies $E_t = E_c$ (GaInAs)−$E_v$(GaAsSb) at the internal heterojunction. One can see that according to the present invention $E_t$ in both instances is less than the transition energies in a one layer quantum well of GaInAs or GaAsSb.

Where the difference between "type I" and "type II" becomes apparent at the heterojunction (GaAs/GaAsSb) is shown in FIG. 9. For the "type II" heterojunction, in the top diagram (FIG. 9a), it is assumed that the electrons were injected from the left and the defect electrons from the right into the active layer. One can see that the barrier prevents the injection of the electrons into the quantum well behind the barrier. If the barrier is not too high (<100 meV), the laser will still function, but the threshold current would be unfavorably high.

Figure 9B:
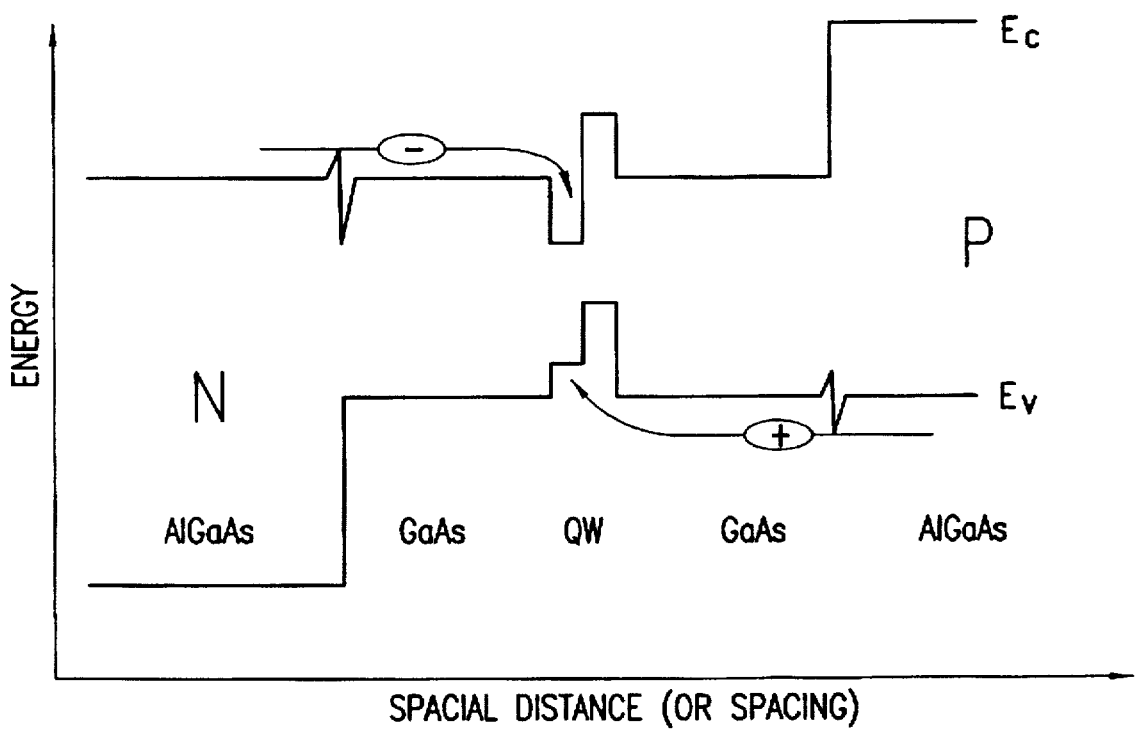

An element of the present invention is that this drawback can be remedied. The barrier position and the injection directions have to be matched (FIG. 9b). The barrier problem discussed here, of course, only occurs with a "type II" heterojunction.

For the GaAs/GaAsSb hetero junction, it has not yet been clarified beyond any doubt whether it is a "type I" or "type II". Probably the absolute value of the energy difference Ec(GaAs)−Ec(GaAsSb) is so small that the polarity signs cannot be unequivocally determined. Technical details in preparation may also play a role. What is completely clear are the relationships in the laser structures for the average infrared range on an InP substrate discussed later on. According to the hitherto published literature, in all the interesting cases it can be assumed that there are "type II" heterojunctions having very big barriers.

Figure 10:
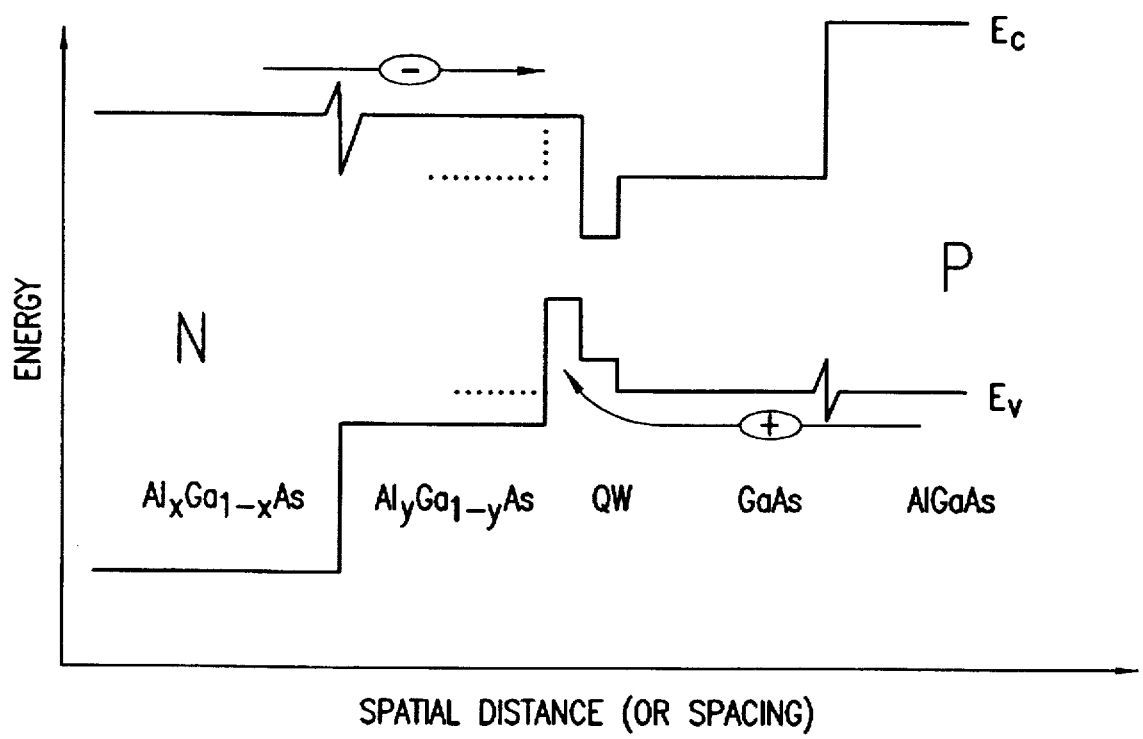
FIG. 10 is a diagrammatic representation of the band diagram of a laser with an asymmetrical waveguide, the dotted line indicates the course of the band with a symmetrical waveguide.

In addition to the above-mentioned solution, there is also a second manner of dealing with the barrier problem. This variant is shown in FIG. 10. Here, for instance, the waveguide is designed asymmetrically. The GaAs layer to the left of the barrier can be replaced with an $Al_yGa_{1-y}As$ layer. In this layer, the conduction band edge energy raises with increasing Al content and at a certain Al content there is a change from "type II" to "type I". However, the optical quality of AlGaAs is not as good and, for this reason, it is not placed in the waveguides very often. Moreover, the Al content of the optical confinement layer on the left then has to be increased. However, note that a 10% Al content has proven to be tolerable.

Other preferred embodiments are shown in the table of FIG. 12. In these examples, the AlGasAs and GaAs layers have been completely or partially replaced by AlGaInP and GaInP layers matched to the GaAs lattice. The combination with two-layered quantum wells of these substituents is useful.

The above-discussed details relate to laser structures which are deposited on GaAs substrates and therefore aimed at the production of a 1.3 μm laser or a 1.55 μm laser. The above-described preferred embodiments, however, are not limited to these applications, but rather other components as well as other substrates, by way of illustration InP, may be employed.

Figure 11:
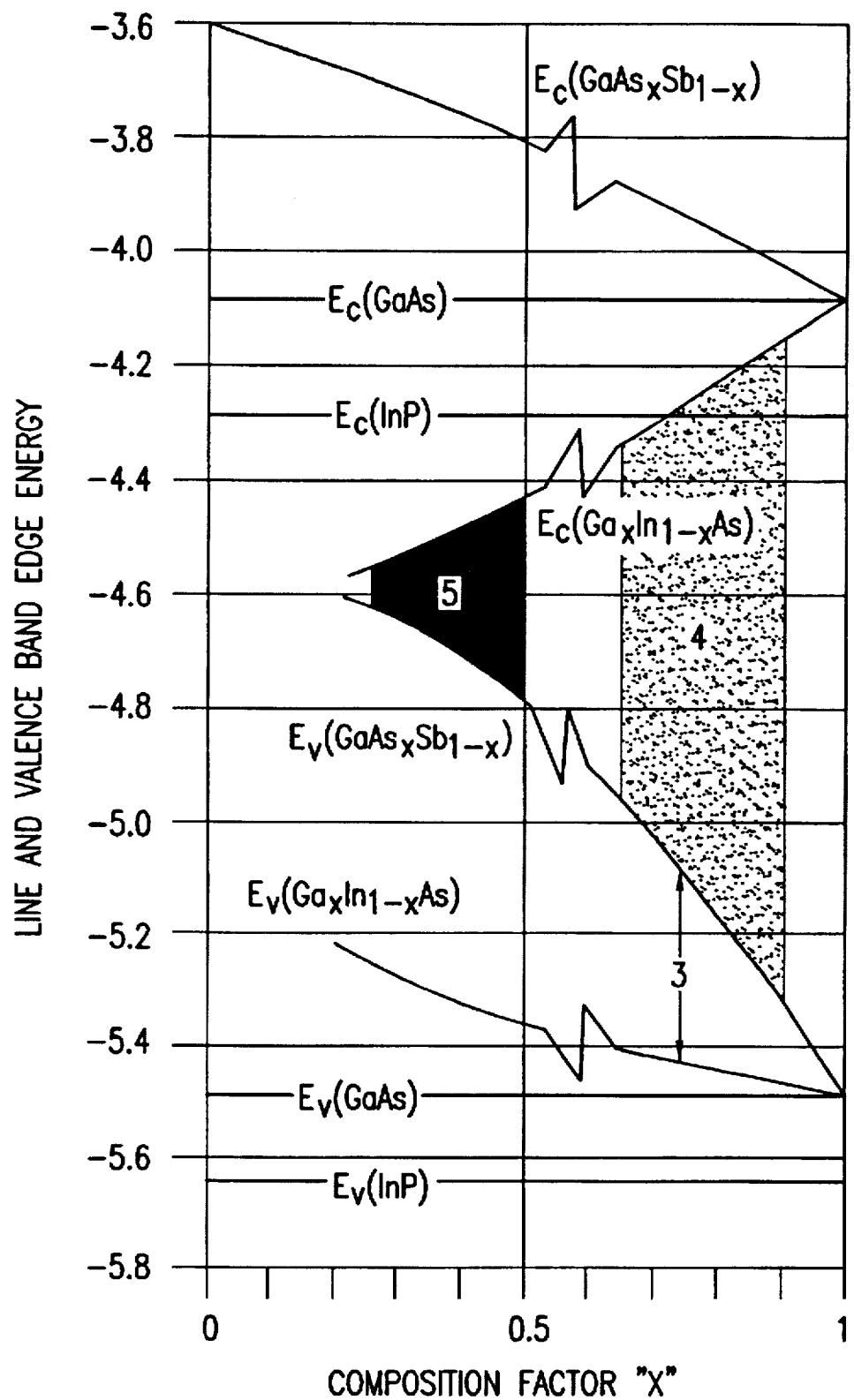
FIG. 11 is an extension of the graph in FIG. 3 with the composition fields suited for GaAs and InP substrate, the zigzag lines indicate that the curves are not continuous, in range 4 adapted to GaAs and in range 5 adapted to InP.

With the presented two-layered quantum layer structures of GaAsSb/GaInAs, lasers having wavelengths in the range of approximately 2 to 5 μm can be fabricated on InP substrates. This is shown in FIG. 11. This figure, like FIG. 3, shows the band edge energies of pseudomorphous $Ga_xIn_{1-x}As$ and $GaAs_xSb_{1-x}$ layers. The independent variable is the composition factor "X". The curve branches on the right side of the diagram relate to structures that have been matched to the GaAs lattice (FIG. 3). Here, the points are the energy levels $E_c$(GaAs) and $E_v$(GaAs).

The light gray hatched region (4) is the alloy region of interest for the 1.3 μm laser. The arrow (3) shows once again what is gained without taking the quantization effect into account if a simple quantum well of GaInAs is replaced by a two-layered well of GaAsSb/GaInAs. In the region of the darker gray hatching (5), the band edge energies are adapted to InP. The relative allocation of the conduction band edges for GaInAs, GaAs Sb, AlInP and InP are known so exactly for structures which have been matched to the InP lattice that it can, with all probability, be assumed that the internal heterojunction and the heterojunction on the left edge are "type II". The data published by Y. Sugiyama et al 1989 indicate that in accordance with the present invention a laser having an almost 5 μm emission wavelength can be fabricated with a two-layered, lattice matched quantum well. Even somewhat longer wave components can be fabricated with two-layered, pseudomorphous quantum wells. Shorter wavelengths up to 2 μm can be achieved without difficulty by utilizing the quantization effect in the correspondingly thin, lattice matched or pseudomorphous quantum wells.

Some preferred embodiments are listed in the table of FIG. 12. The layer reference numbers S1 to S6, used as headings for the columns, are taken from FIG. 5. S5 and S6 are the optical confinement layers, S1 and S4 form the waveguides and S2 or S3 is the two-layered quantum well layer (ZQW). The composition factors have been omitted in the table for lack of space. The additions "i" and "p" behind the layer names (AlGaAs, GaInP, etc.) indicate that the layers are either isomorphous or pseudomorphous. The reference is the substrate on the far right of the table.

The ZQW in the preferred embodiments listed in the table is composed of GaAs Sb and GaInAs. The thickness of the two sublayers is not necessarily the same.

It must be pointed out that internal compensation of the mechanical strain in pseudomorphous ZQW is possible. In this event, one layer is exposed to tensile stress and the other to compressive strain.

This is controlled by the As/Sb and Ga/In relationship in the sublayers. In internal strain compensation, the thickness of the sublayers can be raised up to the respective critical thickness.

Internal strain compensation is only possible on an InP substrate. On a GaAs substrate, the sublayers are always under compressive strain, because the elementary cells of GaAsSb and GaInAs possess larger lattice constants for all the combinations than the GaAs substrate. In this case, only external strain compensation is possible by means of selecting a suited adjacent layer (e.g. gallium-rich GaInP).

Basically, a ZQW can be built into almost any conventional laser structure on a GaAs and InP substrate instead of a single layer quantum well. The structures listed in the table therefore do not cover the entire comprehensive spectrum of all types of lasers.

It is pointed out that the proposed at least two-layered quantum well of GaAsSb/GaInAs having the same effect, i.e. shifting the spectral operation range to longer wavelengths, can be built into all detector and modulator structures in which a conventional quantum well is a function-determining element. Moreover, the use of a ZQW makes it possible to realize a photovoltaic detector. The asymmetrical buildup of the ZQW notably leads to development of a dipole layer if pairs of electron and defect-electron-holes are generated in the ZQW by "spatially indirect absorption". FIGS. 7 and 8 illustrate this without requiring additional figures. The electrons formed by absorption gather in the right part of the ZQW in the GaInAs sublayer and the defect electrons in the left part of the ZQW in the GaAsSb sublayer. This dipole layer is not created on symmetrical quantum wells. For this reason, detector structures having symmetrical quantum wells belong to the class of photoconductors. On these structures, a weak photovoltaic effect is observed only if there are production-based deviations from perfect symmetry.

What is claimed is:

1. A quantum layer structure having at least four semiconductor layers, comprising:

at least two internal layers;

two external barrier layers, said at least two internal layers being disposed between said two external barrier layers;

wherein without an application of an electric voltage, a lower edge of a conduction band of one of said at least two internal layers having quantized hole states provides an absolute minimum with respect to all layers in the quantum layer structure and an upper edge of a valence band of another of said at least two internal layers having quantized electron states provides an absolute maximum with respect to all layers in the quantum structure;

an additional layer disposed between said at least two internal layers having said maximum upper edge of the valence band and said minimum lower edge of the conduction band, said additional layer serving to compensate crystal strains forming in said at least two internal layers and forming a gradual transition band edge between said at least two internal layers for increasing the thickness of the at least two internal layers by which an emission and adsorption wavelength of the quantum layer structure can be increased.

2. The quantum layer structure according to claim 1, wherein said at least two internal layers provide localized overlapping electron and hole states.

3. The quantum layer structure according to claim 2, wherein said electron and hole states overlap to such an extent that a radiation recombination of electrons and holes appears.

4. The quantum layer structure according to claim 3, wherein said radiation recombination is a dominant radiation recombination process.

5. The quantum layer structure according to claim 1, wherein at least one of said at least two internal layers is partially pseudomorphous or lattice matched.

6. The quantum layer structure according to claim 1, wherein said at least four layers of said quantum layer structure have at least two different compounds in at least one of the following groups: II–VI compounds; IV–VI compounds; III–V compounds; and group IV compounds.

7. The quantum layer structure according to claim 1, wherein said quantum layer structure is formed of III–V compounds.

8. The quantum layer structure according to claim 1, wherein one of GaAs and InP is used as a substrate for said quantum layer structure.

9. The quantum layer structure according to claim 1, wherein said semiconductor layers possess compounds of at least two of the following elements: Al, Ga, In, P, As and Sb.

10. The quantum layer structure according to claim 1, wherein said semiconductor layers possess at least three of the following elements: Al, Ga, In, P, As and Sb.

11. The quantum layer structure according to claim 1, wherein at least one of said at least two internal and said external layers are of doped material.

12. The quantum layer structure according to claim 1, wherein at least one quantum layer is embedded in a waveguide structure of Group III–V semiconductor materials, Group III–V semiconductor materials, Group IV–VI semiconductor materials, group IV semiconductor materials or combinations of said semiconductor materials.

13. The quantum layer structure according to claim 1, said structure having three axis, wherein semiconductor materials are chemically composed in such a manner that a part of said internal or external semiconductor layers is biaxially stretched and another part is biaxially buckled.

14. The quantum layer structure according to claim 1, wherein at least one strain compensating layer is placed between at least one of said at least two internal layers, said external layers and said at least two internal layers or said external layers and said substrate.

15. The quantum layer structure according to claim 1, wherein a waveguide structure encloses at least one of said at least two internal layers or said external layers and said quantum layer structure.

* * * * *